(12) United States Patent
Blennerhassett

(10) Patent No.: US 10,236,221 B2
(45) Date of Patent: Mar. 19, 2019

(54) FORMING AN ISOLATION BARRIER IN AN ISOLATOR

(71) Applicant: Analog Devices Global, Hamilton (BM)

(72) Inventor: Alan John Blennerhassett, Kerry (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/600,678

(22) Filed: May 19, 2017

(65) Prior Publication Data

US 2018/0337085 A1    Nov. 22, 2018

(51) Int. Cl.
*H01L 21/8238* (2006.01)
*H01L 21/768* (2006.01)
(Continued)

(52) U.S. Cl.
CPC ...... *H01L 21/823878* (2013.01); *H01L 21/76* (2013.01); *H01L 21/762* (2013.01); *H01L 21/768* (2013.01); *H01L 21/7687* (2013.01); *H01L 21/823481* (2013.01); *H01L 23/5222* (2013.01); *H01L 23/5227* (2013.01);
(Continued)

(58) Field of Classification Search
CPC . H01L 21/76; H01L 21/762; H01L 21/76245; H01L 21/76297; H01L 21/823481; H01L 21/823878; H01L 23/5221; H01L 23/5222; H01L 23/5223; H01L 23/5225; H01L 23/5227; H01L 23/528; H01L 23/5283; H01L 23/642; H01L 23/645; H01L 27/0248; H01L 27/0288; H01L 27/0292; H01L 27/0296; H01L 28/10; H01L 28/40
See application file for complete search history.

(56) References Cited

U.S. PATENT DOCUMENTS

| | | | |
|---|---|---|---|
| 7,947,600 B2 | 5/2011 | Iwaya et al. | |
| 8,364,195 B2 | 1/2013 | Spina et al. | |
| 8,378,776 B1 | 2/2013 | Gabrys et al. | |
| 8,427,844 B2 | 4/2013 | Ho et al. | |
| 2004/0166659 A1* | 8/2004 | Lin | H01L 21/768 438/611 |

(Continued)

OTHER PUBLICATIONS

U.S. Appl. No. 15/600,664, filed May 19, 2017, Blennerhassett et al.

*Primary Examiner* — Eduardo A Rodela
(74) *Attorney, Agent, or Firm* — Wolf, Greenfield & Sacks, P.C.

(57) ABSTRACT

Integrated digital isolators comprise a first transformer coil or capacitor plate mounted on an integrated circuit substrate, and separated from a second transformer coil or capacitor plate via an electrically insulating isolation layer. The electrical isolation that is achieved is dependent upon the material and thickness of the isolation layer. In order to reduce the amount of time required for fabrication while still allowing thick isolation layers to be deployed, in examples of the disclosure a pre-formed solid layer of dielectric material is bonded to the substrate over the first transformer coil or capacitive plate. The preformed solid layer is formed from a thick layer of solid dielectric material, which is ground to the required thickness, either prior to being bonded to the circuit substrate, or thereafter. Such techniques result in a thick isolation layer that is formed more quickly and with lower outgassing risk than conventional spin-coating or deposition techniques.

19 Claims, 12 Drawing Sheets

(51) Int. Cl.
*H01L 21/762* (2006.01)
*H01L 29/06* (2006.01)
*H01L 23/522* (2006.01)
*H01L 23/64* (2006.01)
*H01L 49/02* (2006.01)
*H01L 21/76* (2006.01)
*H01L 21/8234* (2006.01)
*H01L 23/14* (2006.01)
*H01G 4/06* (2006.01)

(52) U.S. Cl.
CPC .......... *H01L 23/642* (2013.01); *H01L 23/645* (2013.01); *H01L 28/10* (2013.01); *H01L 28/40* (2013.01); *H01L 29/0649* (2013.01); *H01G 4/06* (2013.01); *H01L 23/147* (2013.01)

(56) References Cited

U.S. PATENT DOCUMENTS

| | | |
|---|---|---|
| 2004/0177811 A1 | 9/2004 | Kobayashi et al. |
| 2005/0224978 A1 | 10/2005 | Kawate et al. |
| 2008/0061631 A1 | 3/2008 | Fouquet et al. |
| 2010/0096713 A1 | 4/2010 | Jung |
| 2014/0252533 A1 | 9/2014 | O'Sullivan |
| 2014/0346887 A1 | 11/2014 | Bhamidipati et al. |
| 2016/0035672 A1* | 2/2016 | Funaya ............. H01L 21/02164 257/531 |
| 2016/0197066 A1* | 7/2016 | Uchida ................... H01L 28/10 438/3 |
| 2016/0204188 A1* | 7/2016 | Yamaji ................ H01L 23/5223 257/531 |
| 2016/0249453 A1 | 8/2016 | Tatami et al. |
| 2017/0373008 A1* | 12/2017 | Constantino .......... H01L 23/538 |

* cited by examiner

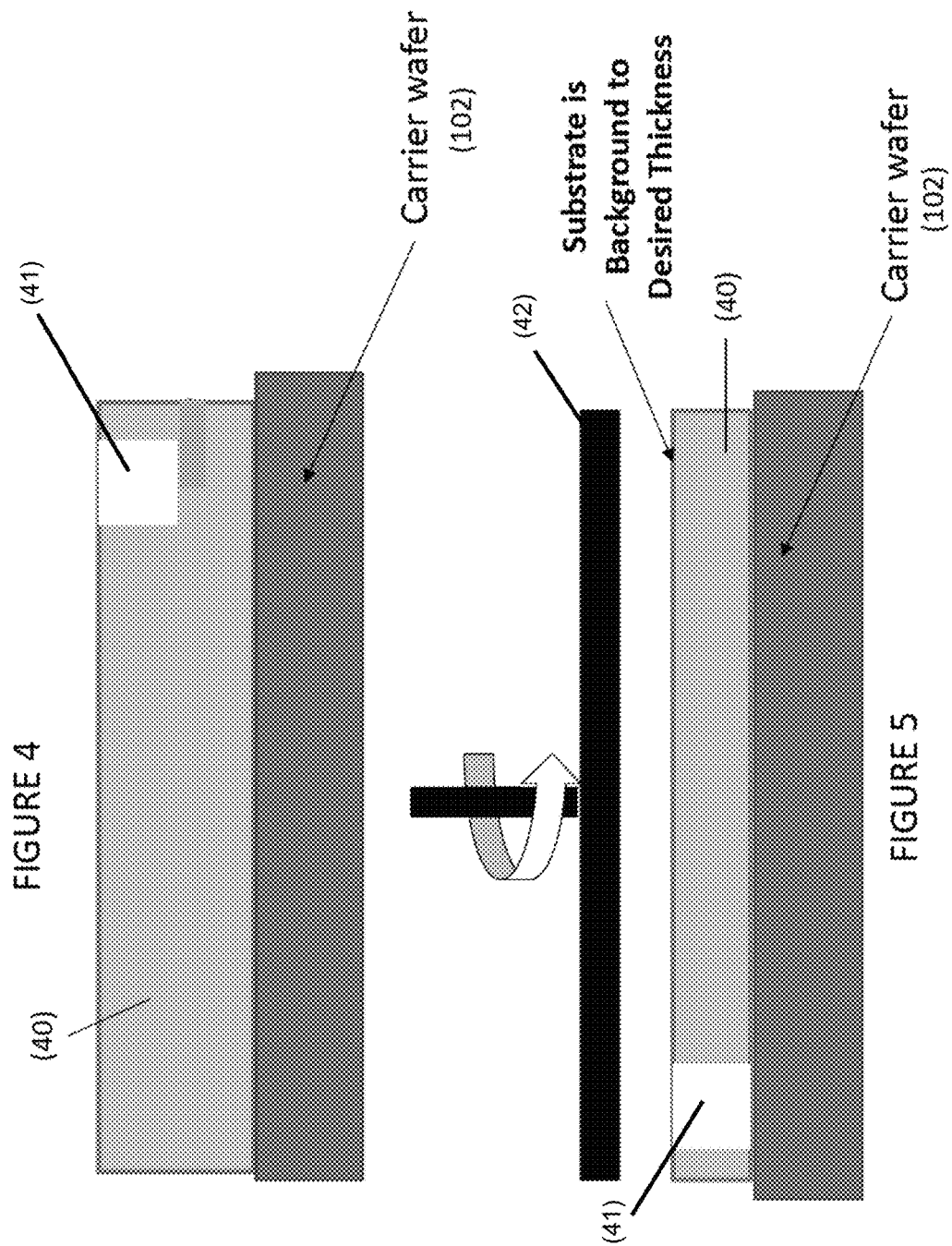

FORMING AN ISOLATION BARRIER IN AN ISOLATOR

FIELD OF THE DISCLOSURE

The present disclosure relates to a method of forming an isolation barrier in an isolator circuit, and a resulting isolator formed with the method.

BACKGROUND

Digital isolators use transformers or capacitors to magnetically or capacitively couple data across an isolation barrier. Transformers pulse current through a coil to create a small, localized magnetic field that induces current in another coil separated by the isolation barrier, whereas capacitors use low currents to create a coupling electric field across the isolation barrier separating respective capacitor plates. One of the performance parameters for a digital isolator is the isolation capability, which may be measured in terms of the 1 minute withstand voltage (i.e. the voltage that the isolation can withstand for 1 minute before isolation breakdown) or the surge level (i.e. a peak surge voltage that the isolation can withstand instantaneously). Generally, the thicker the isolation barrier can be, combined with a material of higher dielectric constant, the greater the isolation capability that will be obtained. Techniques to obtain thick barriers with high isolation properties are therefore of much use in the fabrication of digital isolators.

SUMMARY OF THE DISCLOSURE

In order to reduce the amount of time required for fabrication whilst still allowing thick isolation layers to be deployed, in examples of the disclosure a pre-formed solid layer of dielectric material is bonded to the substrate over the first transformer coil or capacitive plate. The preformed solid layer is formed from a thick layer of solid dielectric material, which is ground to the required thickness, either prior to being bonded to the circuit substrate, or thereafter. Such techniques result in a thick isolation layer that is formed more quickly and with lower outgassing risk than conventional spin-coating or deposition techniques.

One example of the present disclosure therefore provides a method of forming a dielectric insulation layer in an integrated isolator circuit, comprising providing a pre-formed solid dielectric layer of a greater thickness than is required for electrical isolation in an integrated isolator circuit, and processing the pre-formed solid dielectric layer so as to reduce the thickness of the layer to a desired thickness to give a predetermined electrical isolation in dependence on the material properties of the layer. A first electrode set may then be formed on the solid dielectric layer of reduced thickness.

In one example, the pre-formed solid dielectric layer is bonded to a partially formed integrated isolator circuit structure having a second electrode set formed on a substrate wafer prior to processing the pre-formed solid dielectric layer to reduce its thickness. That is, the pre-formed solid dielectric layer is bonded over a first electrode set that is to form part of the integrated isolator circuit, and is then processed to reduce its thickness.

In an alternative example, the pre-formed solid dielectric layer is bonded to a partially formed integrated isolator circuit structure having a second electrode set formed on a substrate wafer after forming the first electrode set on the solid dielectric layer of reduced thickness. That is, the pre-formed solid dielectric layer in this example is first processed to reduce its thickness, then has the first electrode set formed thereon, and is then bonded on top of the second electrode set which is formed on the substrate wafer.

In an example, the pre-formed dielectric layer may be a crystalline or polycrystalline material. In further examples, the pre-formed dielectric layer may be one (or more) selected from the group comprising: fused silica, quartz, aluminum nitride, or silicon.

In some examples, the solid dielectric layer of reduced thickness is between 20 and 80 microns in thickness. The thickness of the layer is determined by the desired electrical isolation properties required, and the dielectric performance of the material from which the layer is made. In this respect, a material of higher relative permittivity may be processed so as to be thinner than a material of lower relative permittivity to give the same electrical isolation properties.

In one example the isolator circuit structure is a digital isolator circuit structure.

Other examples of the present disclosure relate to a method of fabricating an integrated digital isolator circuit, the method comprising fabricating a first pre-cursor part of an integrated digital isolator circuit by forming a first electrode set on an integrated circuit wafer substrate, and fabricating a second pre-cursor part of an integrated digital isolator circuit. The second pre-cursor part is fabricated by processing a pre-formed solid dielectric layer of a greater thickness than is required for electrical isolation in an integrated isolator circuit so as to reduce the thickness of the layer to a desired thickness to give a predetermined electrical isolation in dependence on the material properties of the layer, and forming a second electrode set on the solid dielectric layer of reduced thickness. The second pre-cursor part tis then bonded to the first pre-cursor part to obtain an integrated digital isolator circuit.

In one example of the above, the fabricating of the first pre-cursor part and the second per-cursor part is performed by different fabrication apparatus, and in further examples by different fabrication apparatus at the same time. This has the advantage that production throughput of manufacture of the devices can be increased.

In some examples the method further includes forming a first passivation layer over the first electrode set, the first passivation layer having vias formed therein to permit electrical contact to be made with at least part of the first electrode set. Similarly, the method may also further include forming a second passivation layer over the second electrode set, the second passivation layer having vias formed therein to permit electrical contact to be made with at least part of the second electrode set.

In terms of the form of the electrode sets, in some examples the first and second electrode sets comprise respective conducting coil structures that in use magnetically couple as the coils of a transformer. In contrast, in other examples the first and second electrode sets comprise respective conducting plate structures that in use capacitively couple as the plates of a capacitor.

From a different aspect, further examples of the disclosure provide an integrated isolator circuit structure, comprising: a first electrode set formed on a substrate wafer; a pre-formed solid dielectric layer mounted over the first electrode set; and a second electrode set formed on the mounted pre-formed solid dielectric layer. In these examples the pre-formed solid dielectric layer is a single homogenous layer of a precursor thickness which provides greater electrical isolation than desired, which is back-ground by a grinding tool to the desired thickness during manufacture of the isolator circuit structure in order to give a predetermined electrical isolation property.

In some examples the pre-formed solid dielectric layer is a crystalline or polycrystalline material, and in further examples the pre-formed solid dielectric layer is between around 20 and around 80 microns in thickness after it has been back-ground by the grinding tool. In terms of suitable materials, as mentioned above the pre-formed solid dielectric layer may be made of a material selected from the group comprising: fused silica, quartz, aluminum nitride, or silicon, by way of example.

Further features, examples, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:

FIG. 4 is a diagram of a preformed dielectric layer that is to be incorporated into the digital isolator structure according to a first example of this disclosure;

FIG. 5 is a diagram of the preformed layer undergoing a processing step prior to being incorporated into a digital isolator structure;

DETAILED DESCRIPTION

Integrated digital isolators comprise a first transformer coil or capacitor plate mounted on an integrated circuit substrate, and separated from a second transformer coil or capacitor plate via an electrically insulating isolation layer. Information may be transferred across the isolation layer via magnetic or electric field, depending on whether an inductive coil or capacitive plate arrangement is used. Data encoding and decoding protocols may be used to encode and decode the information passed across the isolation layer to allow for more rapid data transmission. The electrical isolation that is achieved is dependent upon the material and thickness of the isolation layer. Thick isolation layers in the past have been produced by spin-coating polyimide or similar materials onto the substrate bearing the first transformer coil or capacitor, or by depositing thick layers of silicon dioxide (SiO2) or silicon nitride (SiN). However, in order for thick enough layers to be deposited a relatively large amount of fabrication time is required, and multiple processing steps involved. For example, when using polyimide up to three separate spin-coating and curing stages may need to be performed, to achieve the desired polyimide layer thickness. Such multiple processing steps also carries the risk of outgassing during the multiple curing processes which in turn can cause bubbles to form in the layers, thus reducing the yield. In order to reduce the amount of time required for fabrication whilst still allowing thick isolation layers to be deployed, therefore, in examples of the disclosure a pre-formed solid layer of dielectric material is bonded to the substrate over the first transformer coil or capacitive plate. The preformed solid layer is formed from a thick layer of solid dielectric material, which is ground to the required thickness, either prior to being bonded to the circuit substrate, or thereafter. Such techniques result in a thick isolation layer that is formed using a simple one-step process, and hence much more quickly and with lower outgassing risk than conventional spin-coating or deposition techniques.

Examples of the present disclosure will now be described with respect to the accompanying Figures.

Figure 1:
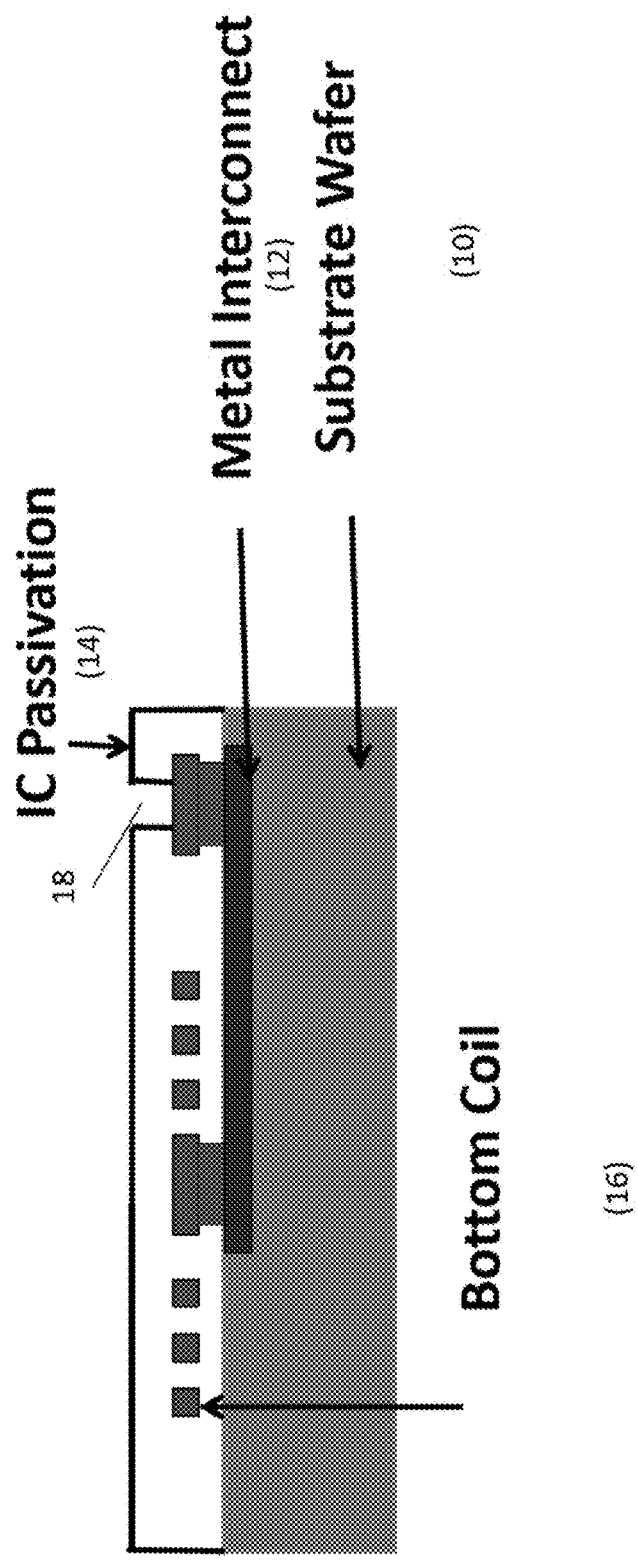
FIG. 1 is a diagram of part of a digital isolator structure forming the basis for an example of this disclosure.
Figure 2:
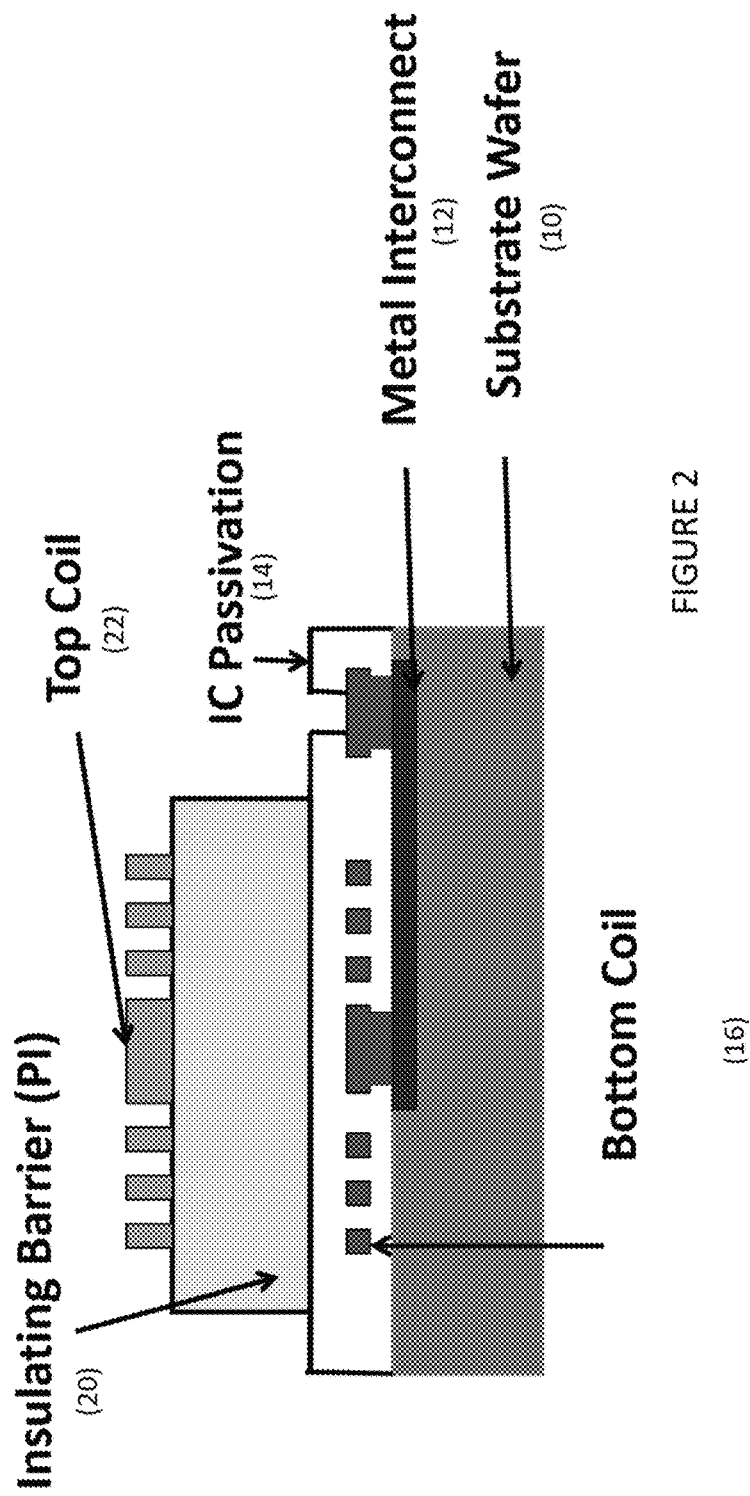
FIG. 2 is a diagram of the digital isolator structure of FIG. 1 after additional processing.
Figure 3:
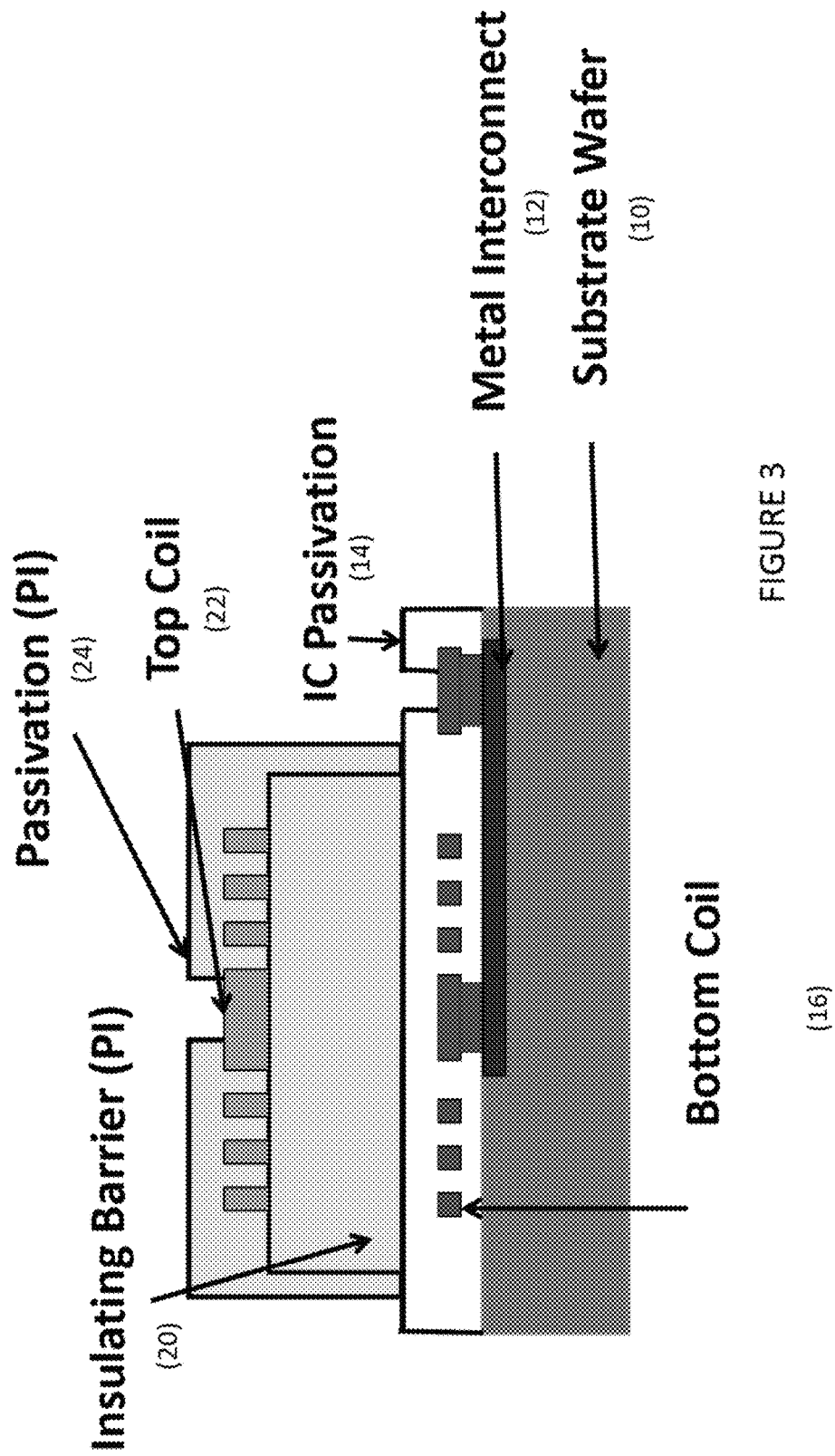
FIG. 3 is a diagram of the digital isolator structure of FIG. 2 after further processing steps.
Figure 6:
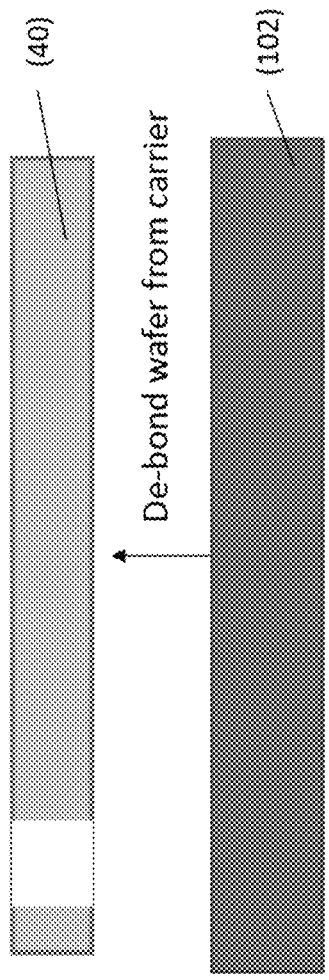
FIG. 6 is a diagram of a further processing step performed on the pre-formed layer.

FIGS. 1, 2, and 3 illustrate example digital isolator structures in various stages of fabrication, described here to provide background context to the present examples. FIG. 1 shows a first bottom coil 16 that forms one half of an isolator data transfer structure formed on a substrate wafer 10 that may contain other integrated circuits—in all embodiments substrate wafer 10 may contain integrated circuits—for example to provide drive signals to the digital isolator. The bottom coil 18, which would typically by a conductive spiral coil formed on the surface of the substrate, has a metal interconnect 12 extending from its central hub over the surface of the substrate 10 to a contact formed under a via 18. A passivation layer 14 is formed over the bottom coil 16, with the via 18 being formed within the passivation layer, through to the contact with the metal interconnect 12 thereunder. The bottom coil 16 may be aluminum or other metallization.

In order to provide suitable isolation an insulating barrier 20 formed from suitable dielectric material is formed on top of the passivation layer 14, as shown in FIG. 2. This insulating barrier may typically be spin-coated polyimide, or deposited silicon nitride or silicon dioxide. Formed on top of the insulating barrier 20 is a top conducting coil 22 that forms the other half of the digital isolator data transfer structure. As shown in FIG. 3, a passivation layer 24 may then be formed over the top coil 22, leaving a via therein to allow access to the center node of the top coil, to act as an input and output node for the top coil. The addition of the passivation layer 24 effectively gives the completed digital isolator structure; drive circuitry will typically be provided elsewhere, for example in the substrate wafer.

In operation the digital isolator magnetically couples data across the isolation barrier 20, using the respective top and bottom coils 22 and 16 as either primary and secondary coils respectively of a transformer, depending on the direction of data transmission. Data encoding and decoding circuitry (not shown) is provided to allow for more rapid data transmission and the ability to handle complex, bidirectional interfaces, such as USB and I²C. One encoding method used is an on/off keying (OOK) technique that encodes rising and falling edges as double or single pulses that drive the transformer coil on the primary side. These pulses are decoded back into rising and falling edges on the transformer secondary side. Such a technique reduces power consumption by 10 to 100 times compared to optocouplers, because power is not continuously applied. Another encoding method involves modulating an RF signal with the data, the modulated RF signal then being applied to the primary coil of the transformer. Whilst effective, this uses more power than the OOK pulsed technique because logic HIGH signals typically result in continuous RF transmission (although this does depend on the RF modulation scheme used).

As discussed previously, although shown in FIGS. 1 to 3 as coils 16 and 23 of a magnetically coupled transformer, in other examples the coils 16 and 23 may be replaced by respective capacitive plates, to provide for electrical coupling and data transfer therebetween. Hence, in the examples described herein the coils of the digital isolator may be replaced by respective capacitive plates, if operation using electric field is required.

Figure 14:
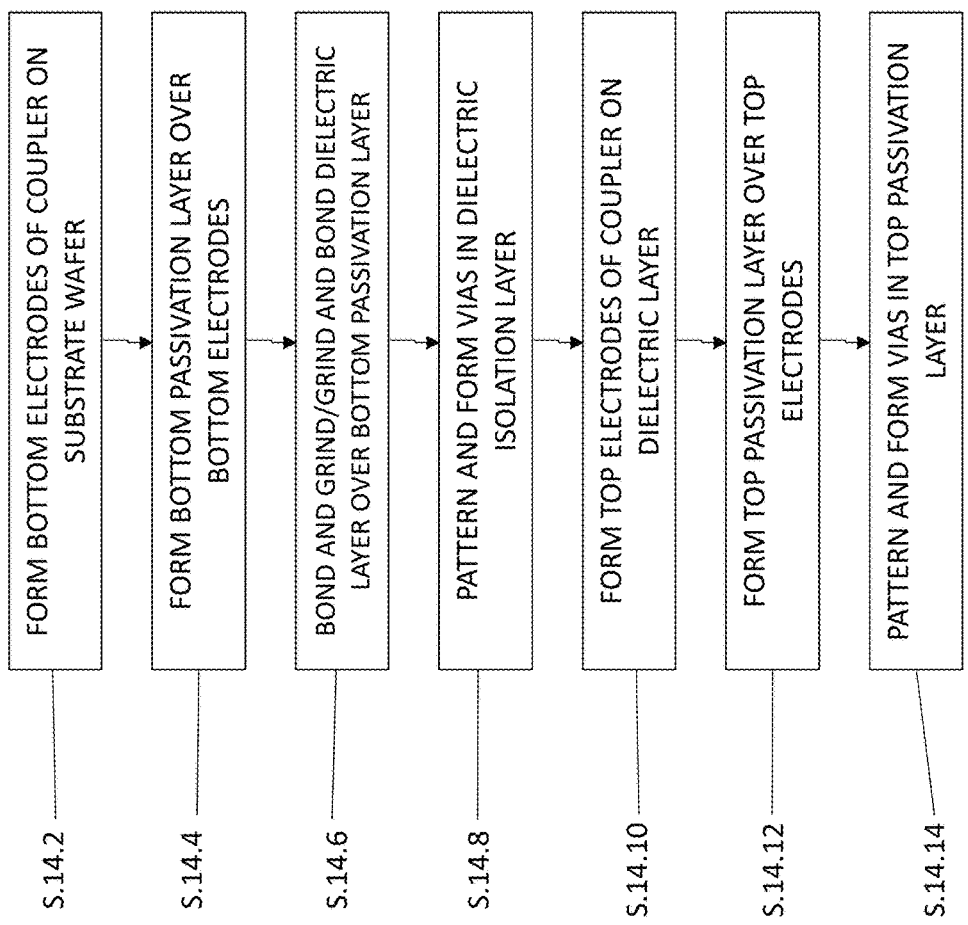
FIG. 14 is a flow diagram illustrating the processing steps involved to create a digital isolator structure according to examples of this disclosure.

The present disclosure relates to the method of formation of the insulating barrier 20, and to a device formed by the method. The overall method provided by examples of the disclosure is shown in FIG. 14, wherein a device structure such as that shown in FIG. 1 and described above is first fabricated at steps 14.2, and 14.4, as described above. This then gives an intermediate device structure as shown in FIG. 1, over which the insulating barrier layer 20 then needs to be formed in accordance with the examples to be described below.

Moving now to FIGS. 4 to 9 which show examples of the present disclosure, as noted above, one of the problems with forming the insulating barrier 20 using conventional spin-coating of polyimide, or deposition of SiN or SiO2 is that it can take a great deal of time to build up thick enough insulating barriers to give the isolation properties required. In particular, building up thick layers of spin-coated polyimide requires multiple spin-coating and curing processes repeated in turn, often up to three times to achieve a 60 micron layer. These repeated processing steps in turn can result in outgassing problems in the spin-coated polyimide layers during subsequent heating of the respective layers for curing, resulting in bubbles forming in the layers, which reduces the electrical isolation obtained, and can cause lifting and peeling of the layers. As a consequence, manufacturing throughput of the isolator structures is reduced, and cost increased. In order to address this issue, therefore, in examples of the present disclosure a thick preformed solid sheet of dielectric material is provided, for example of a crystalline dielectric such as fused silica, quartz, aluminum nitride, or silicon, which is then ground to the desired thickness and bonded to the device, or alternatively bonded to the device and then ground to the desired thickness, in either order. In this way, a thick solid dielectric isolation layer can be provided in a small number of processing steps, without the problems described above relating to the formation of multiple layers of spin-coated polyimide.

Figure 7:
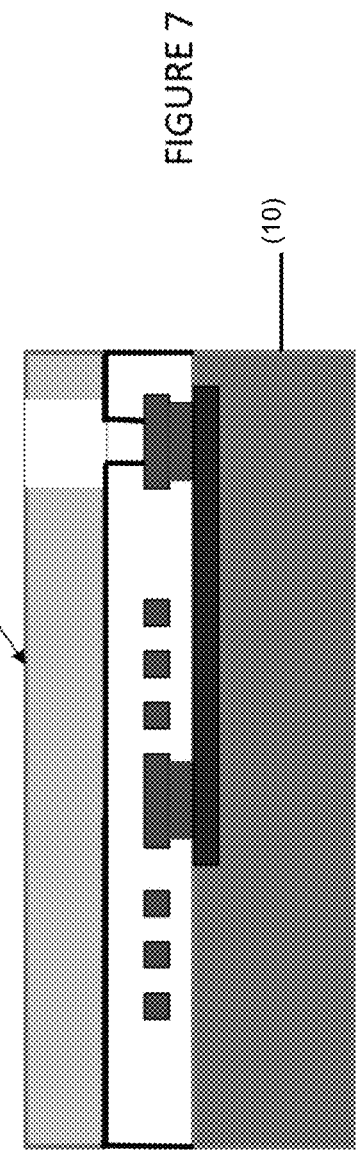
FIG. 7 is a diagram of a digital isolator structure having the preformed layer bonded thereto to provide the dielectric layer.

FIGS. 5 to 9 show two alternative examples of formation of such a solid dielectric isolation layer. Referring first to FIGS. 4 to 7, in a first example a solid dielectric layer 40 of an extended thickness i.e. being of a thicker layer than required for the isolation layer of the isolator being fabricated is mounted on a carrier wafer to allow the dielectric layer to be processed by semiconductor processing tools. In particular, as shown in FIG. 5, the carrier wafer 102 is used to present the extended thickness solid dielectric layer to a grinding tool 42, which then back-grinds the solid dielectric layer to the desired thickness to be used as the isolation layer in the digital isolator. Thereafter, the ground dielectric layer 40 is de-bonded from the carrier wafer 102 (FIG. 6), and then bonded onto the digital isolator circuit, over the passivation layer deposited over the bottom coil thereof (FIG. 7, and step S.14.6).

With respect to the material used for the dielectric layer 40, as noted above it should be a solid material capable of being pre-formed as a layer and ground to the desired thickness. A dielectric crystalline or polycrystalline material in particular is envisaged, although non-crystalline dielectrics may also be used. Suitable materials include fused silica, quartz, aluminum nitride, or silicon, as mentioned earlier. The dielectric layer 40 may be sapphire or any other suitable material. As shown, an interconnecting via 41 may be formed in the dielectric layer 40.

Figure 8:
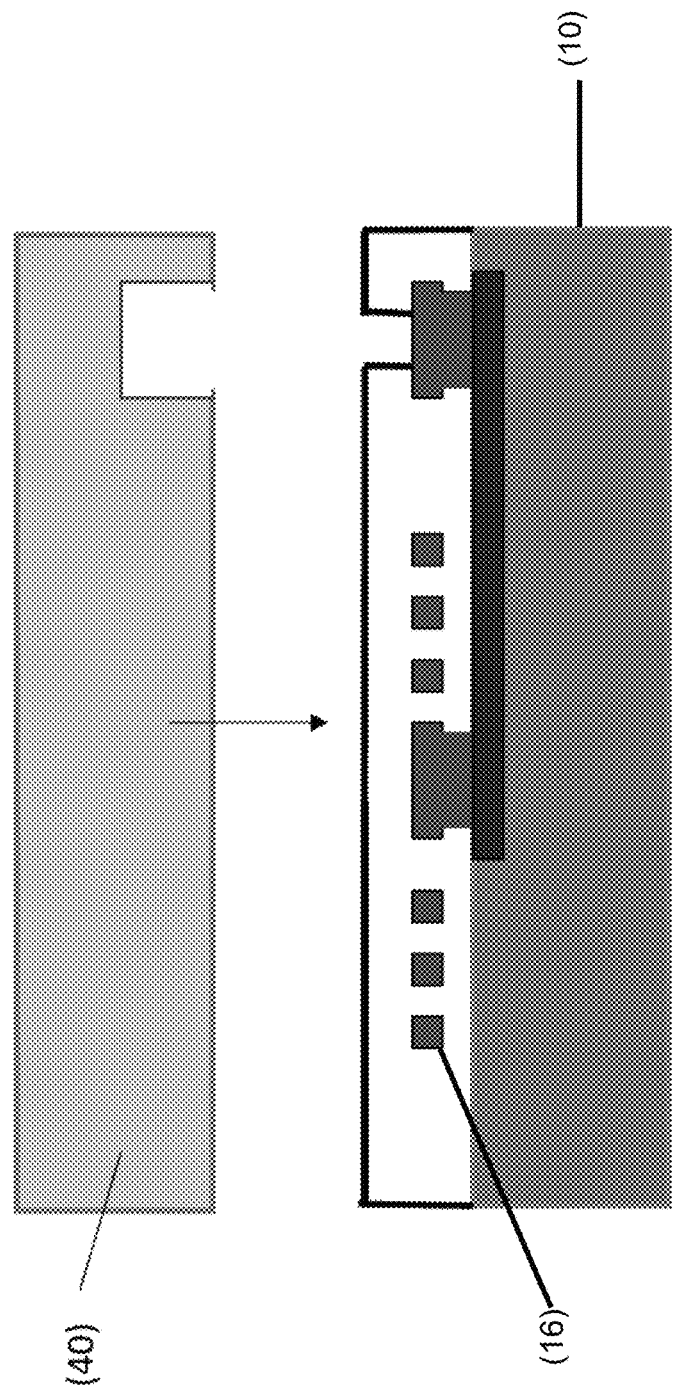
FIG. 8 is a diagram of a preformed dielectric layer being bonded to a digital isolator structure according to a second example of this disclosure.
Figure 9:
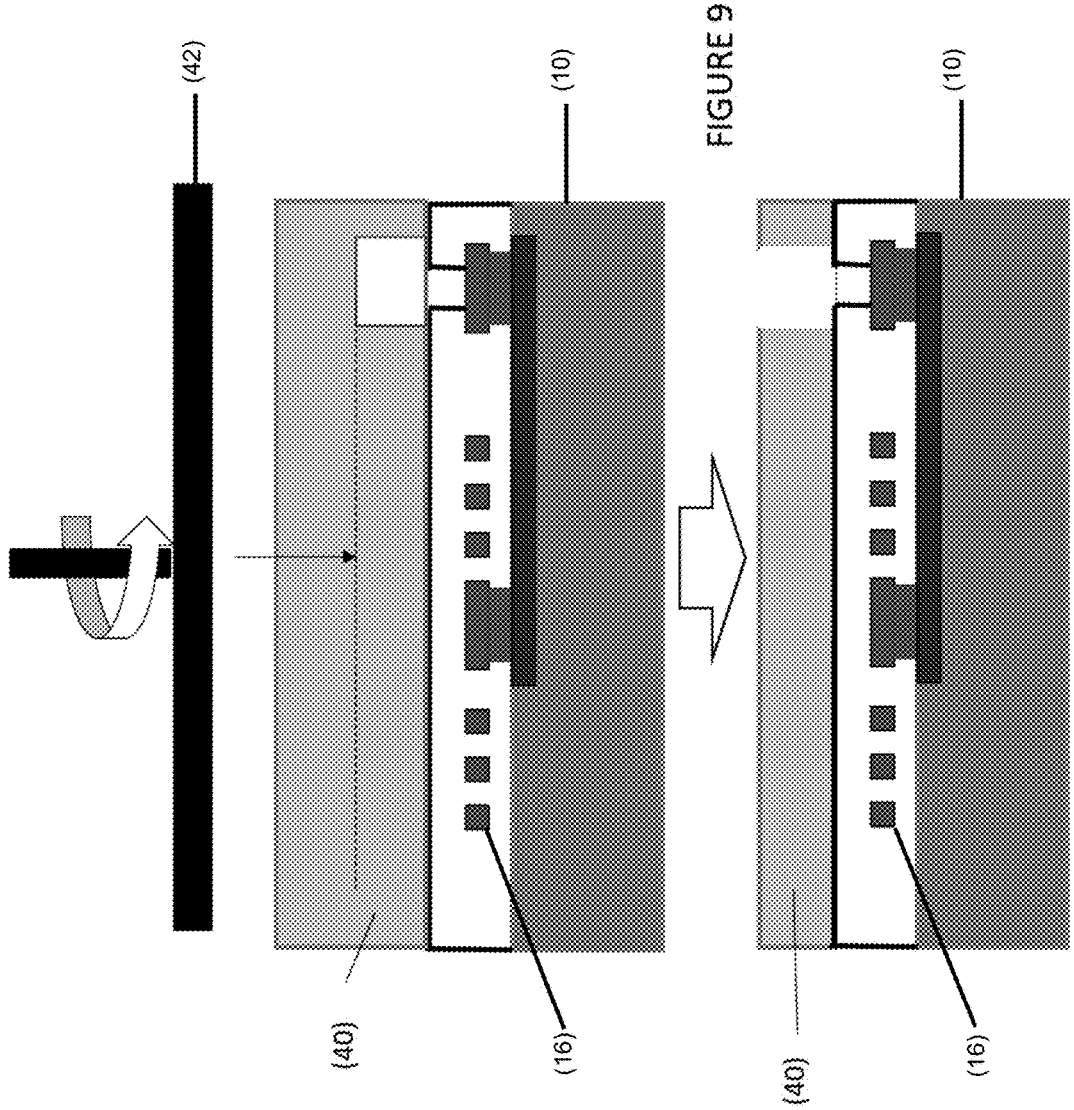
FIG. 9 is a diagram of the preformed dielectric layer undergoing a back-grinding processing step to give a dielectric layer of a required thickness for the digital isolator structure.

A second example way of forming the dielectric layer 40 is shown in FIGS. 8 and 9. Here, the solid dielectric layer 40 of an extended thickness i.e. being of a thicker layer than is required for the isolation layer of the digital coupler is bonded to the passivation layer 14 formed over the bottom coil 16, and is then back-ground (see FIG. 9) to the desired thickness—represented by the horizontal dashed line—of dielectric layer by a grinding tool 42. In this way, a thick dielectric layer is formed on the digital isolator with few processing steps, and without any of the problems of multiple polyimide depositions.

One advantage of using a pre-formed solid dielectric layer, such as a crystalline layer, is that the via required to allow the bottom coil contact to be accessed can be pre-formed therein. That is, in both example described above the via can be formed in the solid dielectric precursor layer prior to back grinding, for example by forming a notch in the material to the desired thickness of the eventual dielectric layer. The solid layer is then back-ground, as described above, from the opposite side to the pre-formed notch to thin the layer of material. Once the material has been thinned to a sufficient extent that the bottom of the pre-formed notch is exposed, the notch may then act as the required via in the layer.

Figure 10:
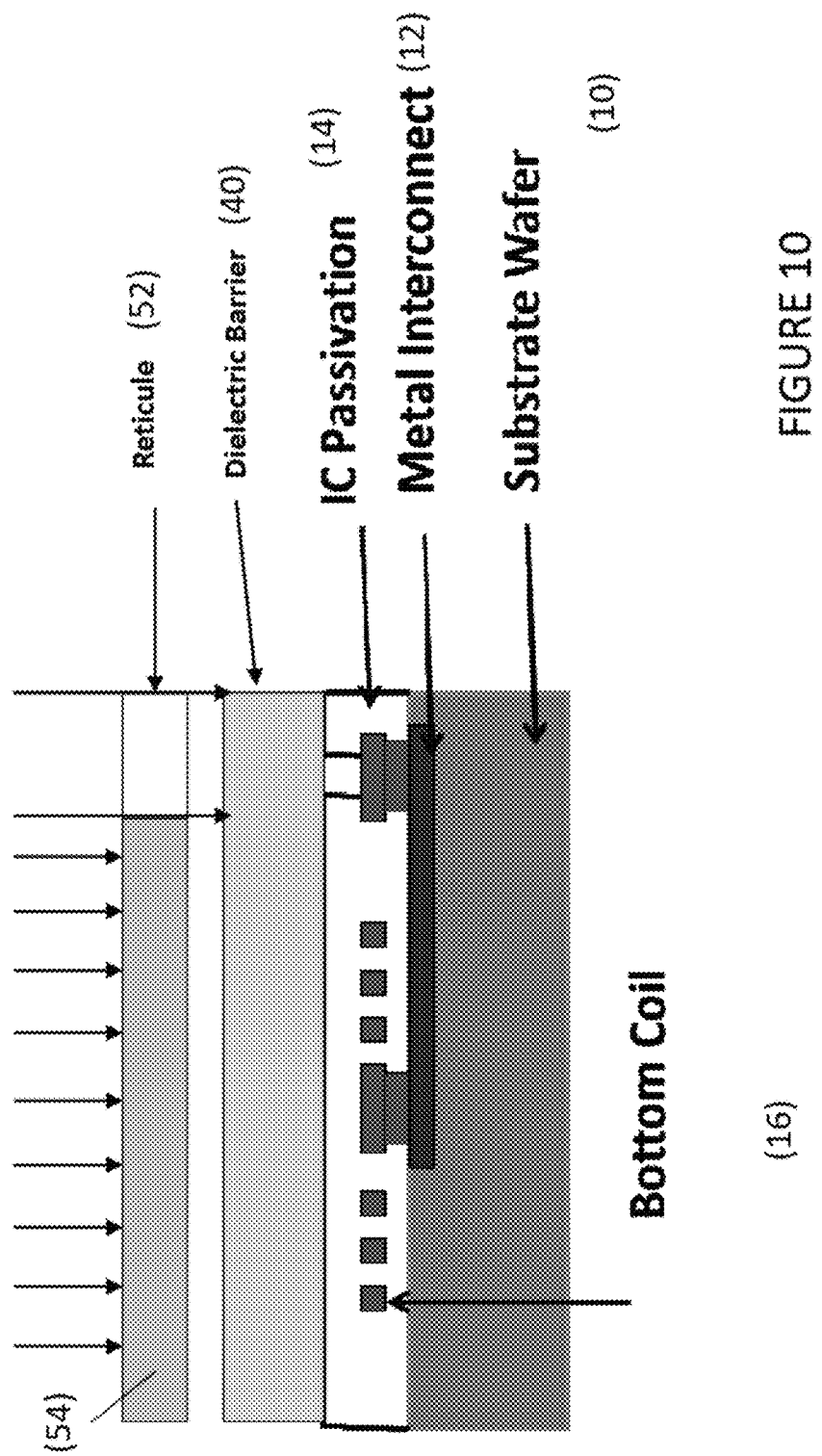
FIG. 10 is a diagram of a digital isolator structure undergoing a further processing step according to an example of the disclosure.
Figure 11:
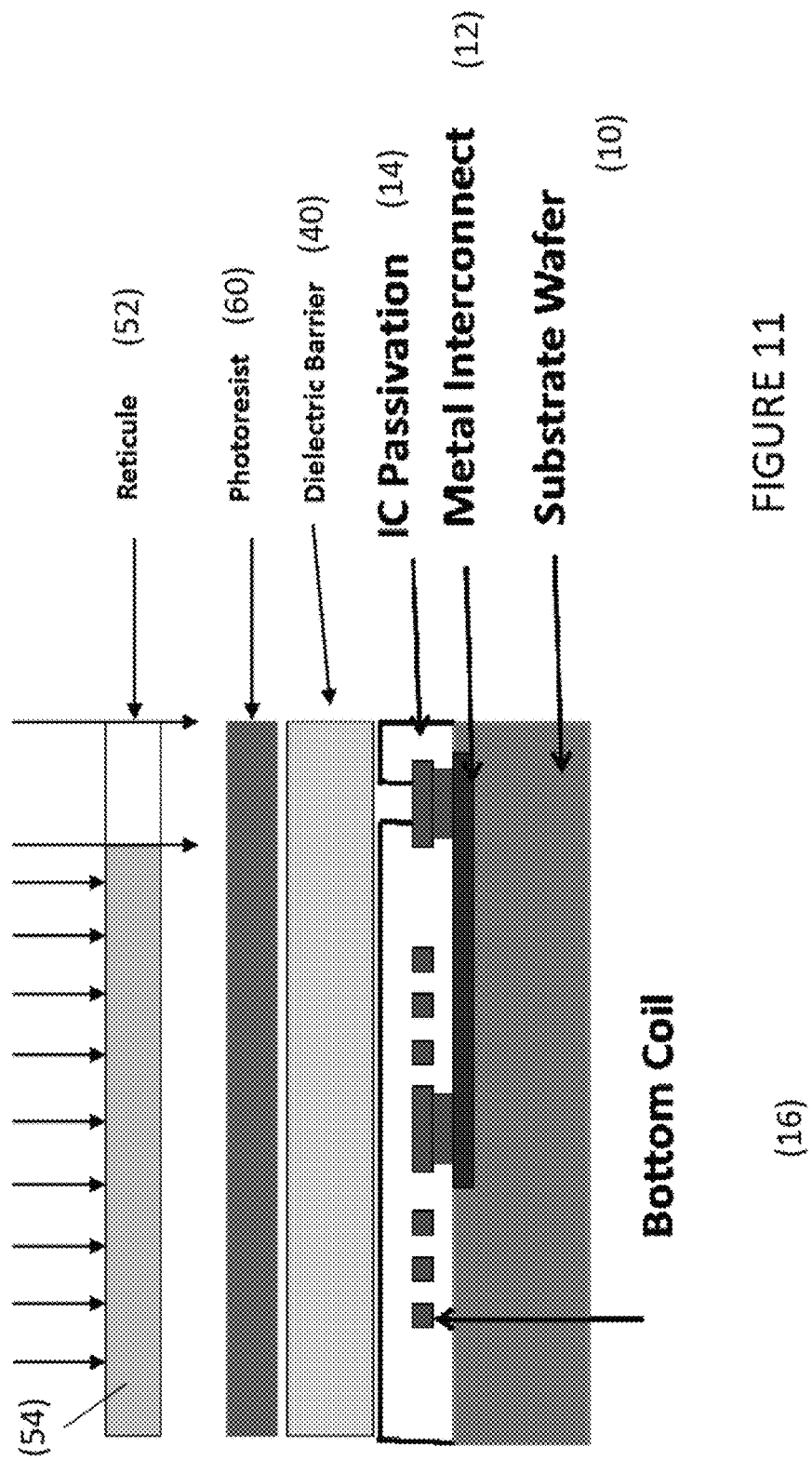
FIG. 11 is a diagram of a digital isolator structure undergoing an alternative further processing step to that of FIG. 10.

Alternatively, if no via is formed within the layer using the grinding process, then once the back-ground dielectric barrier layer 40 has been bonded on to the wafer, it can then be patterned and any necessary vias formed therein for interconnects (s.14.8). If the material of the dielectric barrier is photosensitive, it may be patterned directly using an appropriate die provided with appropriately positioned reticules to define the desired via position, as shown in FIG. 10. Alternatively, if the dielectric barrier 40 is not photosensitive, a layer of photo-resist 60 may be deposited on top of the barrier 40, which is then patterned appropriately to define the via location, as shown in FIG. 11. In either case, the dielectric barrier may then be etched to from the necessary via 18 to allow connection to the bottom coil 16.

Figure 12:
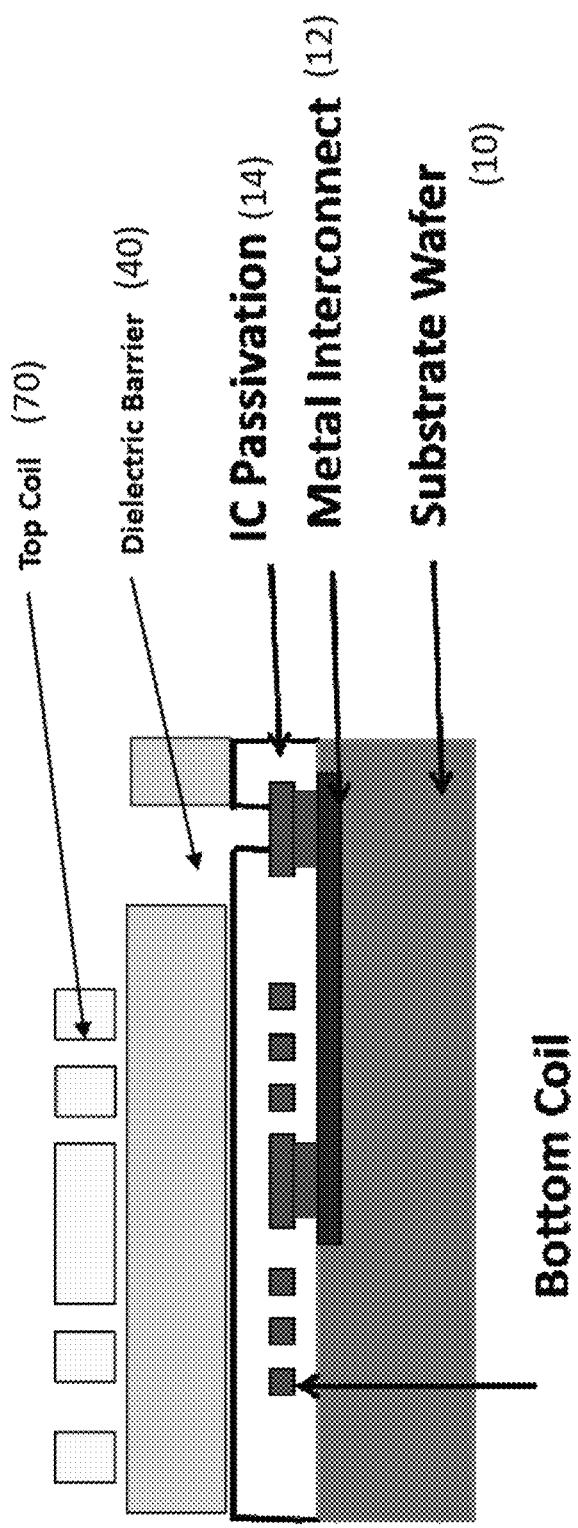
FIG. 12 is a diagram of a digital isolator structure after a further processing step.
Figure 13:
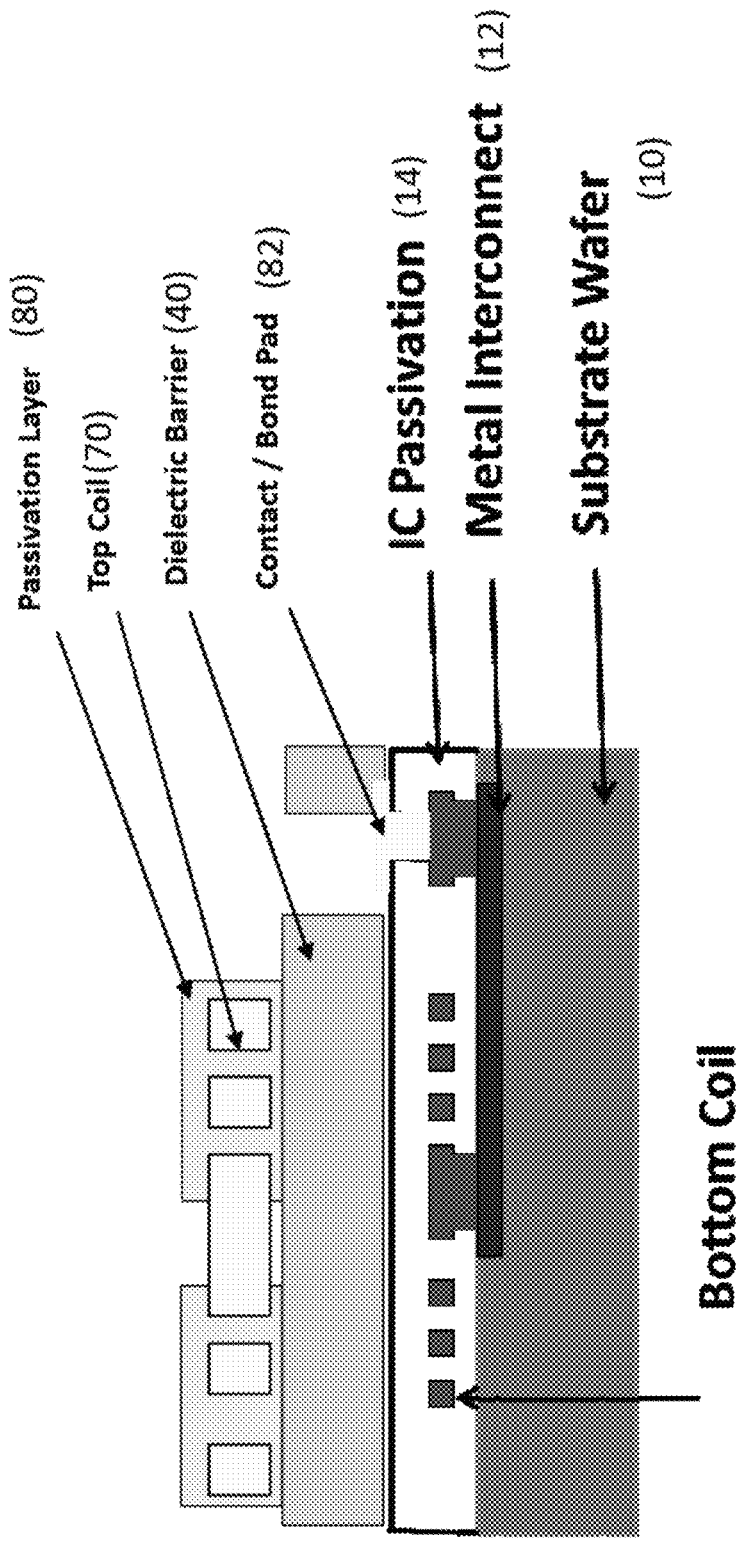
FIG. 13 is a diagram of a digital isolator structure after a yet further processing step.

Once the dielectric barrier 40 has been bonded and ground to the necessary thickness, and the via formed therein (if necessary), further patterning and deposition of a metallization layer can occur, in order to form the top transformer coil 70 of the isolator, as shown in FIG. 12 (s.14.10). A second passivation layer 80 is then formed over the top coil 70 (s.14.12), having a via formed therein (s.14.14) to allow access to an input and output electrode of the coil, to allow data signals to be fed to and obtained therefrom. The provision of the second passivation layer effectively completes the fabrication of the isolator structure, but of course drive circuitry and other connections into the remainder of the IC would be required to provide a complete device. Such details are not necessary for and are beyond the scope of the present disclosure, however, which is concerned with the fabrication of the isolator structure, and particular the formation of the dielectric barrier layer 40.

In this regard, and returning to the formation of the dielectric barrier layer 40, as mentioned above, the layer is provided as a preformed solid layer, of extended thickness than is required for the dielectric layer of the intended digital isolator circuit, but which is then back-ground to the desired thickness to give the electrical isolation required, either prior to or after it has been bonded to the integrated circuit substrate. In terms of material, the solid layer may be a crystalline or polycrystalline dielectric material. Some suitable materials include fused silica, quartz, aluminum nitride, or silicon, as mentioned earlier, and the thickness of the isolation layer once ground may be, for example, 20 to 80 microns thickness, although the pre-cursor layer of material prior to back-grinding will be thicker than this, and might be, for example, as large as 760 microns in thickness, prior to back-grinding. The thickness of the isolation layer once ground is a design parameter for the isolation circuit as a whole, and is dependent on the desired isolation performance required, and the material from which the layer is made. As would be understood, if a material of higher relative permittivity is used, then the thickness of the layer can be lower to achieve a particular isolation performance than if a material of lower relative permittivity is used.

Within the examples above the formed dielectric layer is bonded on top of the bottom coil of the isolator prior to being patterned and metallized to form the top coil of the isolator. In an alternative example, however, where the dielectric layer is mounted on a carrier wafer for the back-grinding process prior to then being de-bonded and mounted on the digital isolator structure, then the back-ground dielectric layer, once ground to the required thickness can be retained on the carrier wafer and have the top coil 70 and passivation layer 80 formed thereon, whilst still on the carrier wafer. After the formation of the passivation layer 80 over the top coil 70 the dielectric layer would then be de-bonded from the carrier wafer, and, carrying the toil coil metallization and passivation layer thereon, then be bonded onto the top of passivation layer 14 over bottom coil 16, to give the full device. Such a procedure gives the advantage that the device may be created in two halves (a bottom coil half mounted on the IC substrate, and a top coil half mounted on the dielectric layer), with each half being produced simultaneously in parallel by different fabrication lines, with the resulting pre-cursor halves then being capable of being brought together and simply bonded one on top of the other to give a full device. With such parallel production techniques the total fabrication throughput of complete devices can be increased per unit time.

With the above examples, therefore, a method of forming an isolation layer in a digital isolator structure is provided that is able to form a thick isolation layer in fewer processing steps and with greater reliability by virtue of applying a pre-formed solid dielectric layer to the wafer as the isolation layer. The preformed solid layer, which may be crystalline or polycrystalline material, is provided at much great thickness, for example up to 760 microns, than is required as a dielectric layer, and is then back-ground by a grinding tool to precisely the desired thickness required to give the intended electrical isolation. The resulting layer may be, for example of 40 to 80 microns thickness, dependent on the isolation required.

Various further modifications, whether by way of addition, deletion, or substitution may be made to the above mentioned examples to provide further examples, any and all of which are intended to be encompassed by the appended claims.

What is claimed is:

1. A method of forming a dielectric insulation layer in an integrated isolator circuit, comprising:
   providing a pre-formed solid dielectric layer of a first thickness;
   creating a thinned dielectric layer of uniform thickness and substantially planar upper and lower surfaces by thinning the pre-formed solid dielectric layer to a target thickness less than the first thickness; and
   forming a first electrode set on the thinned dielectric layer.

2. A method according to claim 1, further comprising bonding the pre-formed solid dielectric layer to a partially formed integrated isolator circuit structure having a second electrode set formed on a substrate wafer prior to creating the thinned dielectric layer and forming the first electrode set on the thinned dielectric layer.

3. A method according to claim 1, and further comprising bonding the thinned dielectric layer to a partially formed integrated isolator circuit structure having a second electrode set formed on a substrate wafer prior to forming the first electrode set on the thinned dielectric layer.

4. A method according to claim 1, wherein the pre-formed solid dielectric layer is a crystalline or polycrystalline material.

5. A method according to claim 1, wherein the pre-formed solid dielectric layer comprises fused silica, quartz, aluminum nitride, or silicon.

6. A method according to claim 1, wherein the target thickness is between 20 and 80 microns.

7. A method according to claim 1, wherein the integrated isolator circuit is a digital isolator circuit.

8. A method of fabricating an integrated digital isolator circuit, comprising:
   fabricating a first pre-cursor part of the integrated digital isolator circuit by forming a first electrode set on an integrated circuit substrate;
   fabricating a second pre-cursor part of the integrated digital isolator circuit by:
      processing a pre-formed solid dielectric layer of a greater thickness than is required for electrical isolation in the integrated digital isolator circuit so as to produce a reduced thickness solid dielectric layer of a desired thickness to give a predetermined electrical isolation in dependence on material properties of the pre-formed solid dielectric layer; and
      forming a second electrode set on the reduced thickness solid dielectric layer; and
   bonding the second pre-cursor part to the first pre-cursor part to obtain the integrated digital isolator circuit.

9. A method according to claim 8, wherein the fabricating of the first pre-cursor part and the second per-cursor part is performed by different fabrication apparatus.

10. A method according to claim 9, wherein the fabricating of the first pre-cursor part and the second per-cursor part is performed by different fabrication apparatus at the same time.

11. A method according to claim 8, further comprising forming a first passivation layer over the first electrode set, the first passivation layer having vias formed therein electrically contacting at least part of the first electrode set.

12. A method according to claim 11, further comprising forming a second passivation layer over the second electrode set, the second passivation layer having vias formed therein electrically contacting at least part of the second electrode set.

13. A method according to claim 8, wherein the first and second electrode sets comprise respective conducting coil structures of a transformer.

14. A method according to claim 8, wherein the first and second electrode sets represent plates of a capacitor.

15. A method according to claim 8, wherein the pre-formed solid dielectric layer comprises fused silica, quartz, aluminum nitride, or silicon.

16. A method of fabricating an integrated isolator circuit, comprising:
   forming a first dielectric layer of reduced thickness from a second dielectric layer of a greater thickness than the first dielectric layer;
   bonding the first dielectric layer of reduced thickness to a partially formed integrated isolator circuit structure having a first electrode; and
   forming a second electrode on the first dielectric layer of reduced thickness.

17. The method of claim 16, wherein the partially formed integrated isolator circuit comprises a passivation layer formed over the first electrode.

18. The method of claim 16, wherein the first dielectric layer has a thickness between 20 to 80 microns.

19. The method of claim 16, wherein the first dielectric layer has substantially planar upper and lower surfaces.

* * * * *